United States Patent [19]

Schmidt et al.

[11] Patent Number: 4,884,023
[45] Date of Patent: Nov. 28, 1989

[54] METHOD AND APPARATUS FOR DETERMINING THE ROTOR RESISTANCE OF A ROTATING-FIELD MACHINE

[75] Inventors: Rolf Schmidt; Hubert Schierling, both of Erlangen, Fed. Rep. of Germany

[73] Assignee: Siemens Aktiengesellschaft, Munich, Fed. Rep. of Germany

[21] Appl. No.: 294,830

[22] Filed: Jan. 9, 1989

[30] Foreign Application Priority Data

Jan. 14, 1988 [DE] Fed. Rep. of Germany ....... 3800915

[51] Int. Cl.$^4$ ...................... G01R 31/02; G01R 27/02
[52] U.S. Cl. ............................. 324/158 MG; 324/62; 324/545; 364/550
[58] Field of Search ................ 324/158 MG, 545, 62; 340/648; 322/99; 318/490; 364/482, 550

[56] References Cited

U.S. PATENT DOCUMENTS

| | | | |
|---|---|---|---|
| 4,441,065 | 4/1984 | Bayer et al. | 324/158 MG |
| 4,626,761 | 12/1986 | Blaschke | 324/158 MG |
| 4,829,234 | 5/1989 | Gretsch | 324/62 |

Primary Examiner—Ernest F. Karlsen
Attorney, Agent, or Firm—Kenyon & Kenyon

[57] ABSTRACT

In order to determine the rotor resistance of a rotating field machine, a current is impressed in the stator via a field-oriented control, which current has a harmonic component above the nominal frequency of the machine. From the current, the rotor position and a readjustable parameter value for the rotor resistance, a current model calculates a field-parallel EMF component EF1, the harmonic component EF1$_\sim$ of which is isolated. In addition, a voltage model calculates from the current and the voltage, the EMF vector as the current component reference value EF1' and its harmonic component EF1'$_\sim$. A correction control CR1 readjusts the parameter $r_R$ of the rotor resistance until the difference of the two isolated harmonic EMF components disappears. The test signal has practically no influence on the flux and the torque of the machine. At the same time, the stator resistance $r_S$ and the stray inductance $x_{St}$ can be determined.

14 Claims, 3 Drawing Sheets

METHOD AND APPARATUS FOR DETERMINING THE ROTOR RESISTANCE OF A ROTATING-FIELD MACHINE

BACKGROUND OF THE INVENTION

1. Field of the Invention

The invention relates to a method for determining the rotor resistance of a rotating field machine, in particular at stand-still or at low load, by means of a voltage model for the machine provided with current values and voltage values and a current model for the machine provided with current values and signals describing the rotor axis and a model parameter for the rotor resistance of the machine. The invention also relates to apparatus for carrying out the method.

2. Description of the Prior Art

For the field-oriented control or regulation of modern highly dynamic rotating-field machines, information regarding the position of the field axis is required. In order to avoid the installation of separate measuring probes in the machine, computing models are frequently used which compute the physical processes linked with the flux of the machine from readily accessible measurement variables.

Thus, it is possible, for instance, to determine from the machine voltage, the flux inducing this voltage. More particularly, the voltage yields, after subtracting the ohmic voltage drop due to a parameter $r_S$ for the stator resistance and the stray voltage drop defined by a parameter $x_{st}$ for the stray inductance, the EMF induced in rotor. The integral function of the EMF corresponds to the flux in the rotor of the machine. In such a "voltage model" the integration of the EMF can frequently be dispensed with since the latter represents merely a rotation by 90°. At low speeds, however, the voltage model does not work satisfactorily.

In the so-called "current model", one starts out with the current fed into the machine and the position of the rotor axis, so that the flux induced in the rotor can be calculated, taking into consideration the rotor resistance. The rotor resistance itself, however, changes as a function of the operating temperature and is not accessible to direct measurement. This introduces an error into the values of the flux axis calculated in the current model.

In German Offenlegungsschrift 34 30 386 a method for operating a rotating field machine is described, in which the field angle is determined by means of the voltage model, and the voltage model itself is corrected by means of a current model. The rotor resistance parameter used in the current model is control. For this control series of square-ware pulses are added to the reference value for the magnetizing current. Therefore corresponding pulse-shaped changes of the magnetizing current occur in the machine which cause, by a smoothing brought about by the time constant of the rotor, a corresponding periodic change of the flux or the EMF, respectively.

The amplitude of the EMF vector or flux vector calculated in the current model changes with a time constant different from the time-dependent of the vector amplitude calculated in the voltage model, so that temporarily an amplitude difference occurs which depends on the error due to the rotor resistance. Thus, the amplitude difference correlated with the pulse-shaped supplemental reference values is determined and is compensated by readjustment of the rotor resistance parameter.

In this known method, a supplemental reference value with a harmonic waveform and a high frequency would lead to the situation wherein the flux in the machine changes only slightly and therefore, the error function which enters into the different dynamics of the two vector amplitudes, cannot be calculated with sufficient accuracy. Therefore, appreciable periodic changes of the flux are unavoidable which, while not influencing the active current, do influence the torque which is given by the product of the active current and the flux.

OBJECTS AND SUMMARY OF THE INVENTION

It is therefore an object of the invention to identify the rotor resistance of a rotating-field machine in a different manner.

In order to determine the rotor resistance of a rotating field machine, a current is impressed in the stator via a field-oriented control. The field parallel component of said current has a harmonic component above the nominal frequency of the machine. From the current, the rotor position and a readjustable parameter value for the rotor resistance, a current model calculates a field-parallel EMF component EF1, the harmonic component EF1$_\sim$ of which is isolated. In addition, a voltage model calculates from the current and the voltage, the EMF vector as the reference value EF1' and its harmonic component EF1'$_\sim$. A correction control readjusts the parameter $r_R$ of the rotor resistance until the difference of the two isolated harmonic EMF components disappears. The test signal has practically no influence on the flux and the torque of the machine. At the same time, the stator resistance $r_S$ and the stray inductance $x_{St}$ can be determined.

BRIEF DESCRIPTION OF THE INVENTION

The invention will be explained in greater detail with the aid of two embodiments illustrated in the figures, wherein FIG. 1 shows a field-oriented drive of a rotating-field machine with a device constructed in accordance with the invention;

DETAILED DESCRIPTION OF THE INVENTION

Figure 1:
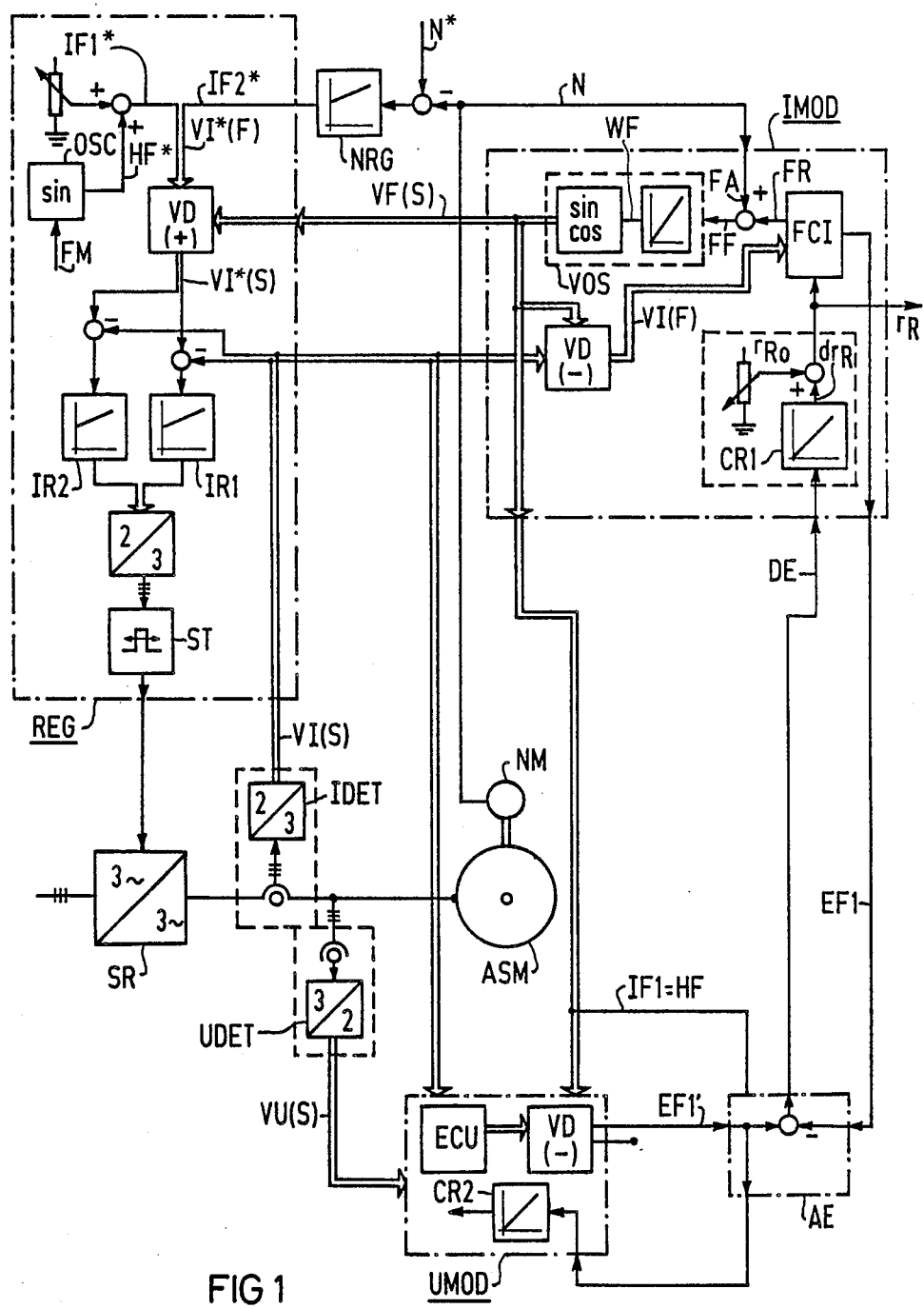

In FIG. 1, the principle of a field-oriented control is shown for an asynchronous machine ASM, the stator windings of which are fed by a static converter SR. In the corresponding control device REG, a field-oriented current reference vector VI*(F) is derived having a component IF1*. IF1* parallel to the field axis and is set in accordance with a desired flux magnitude. A component IF2* perpendicular to the field gives the desired active current. IF2* may be derived, for instance, at the output of a speed control NRG, which keeps the speed N, measured by means of a tachometer generator NM, at a predetermined reference value N*.

The converter SR is controlled by control signals of a control unit ST. The output control voltages of unit ST are formed by a combination of coordinate transformations and an auxiliary current control as described below. In certain converters, it may also be necessary to use an auxiliary voltage control.

The field-oriented control device REG has an input for a signal describing the position of a field axis relative to the stator. Vector signals are shown in the figures as double arrows since they advantageously consist of two individual signals which correspond to the two Cartesian components of the respective vector in an orthogonal reference system. The field axis can be represented by a corresponding stator-related vector VF(S), the components of which in a stator reference system are given by the cosine and a sine of the angle WF between the field axis and an axis of the stator reference system. By means of these angular functions, vector components can be converted easily from one coordinate system into the other by a so-called vector rotator. In the present case, the current reference vector VI*(F) described above is represented by its reference components IF1 and IF2 and converted into the corresponding current reference vector VI*(S) in the stator reference system by means of a corresponding vector rotator VD(+) by rotating VI*(F) by an angle WF defined by VF(S). A current detector IDET which converts the phase currents measured on the stator leads into the Cartesian components of a stator-related actual current vector VI(S). The difference of the actual vector component and the reference vector components are fed in parallel to component controls IR1 and IR2, the output signals of which are converted by the 2/3 converter to generate the three control variables for converter ST.

Therefore control device REG thus forces the reference current vector to be equal to the actual current vector by the provision that the control difference of a stator-related component is compensated. This vector control can, of course, also take place in another coordinate system; for instance, the actual-current vector VI(S) can be transformed into the field-oriented coordinate system by means of vector VF(S) and compared there with the field-oriented vector VI*(F), where then the corresponding current controllers from the field-oriented components of a control vector which subsequently can be transformed back into the stator reference system by means of the vector VF(S).

The field-oriented regulating device REG therefore corresponds to the conventional structure, as first described in U.S. Pat. No. 3,824,437 for asynchronous machines and in U.S. Pat. No. 3,775,649 for synchronous machines. FIGS. 6, 7 and 8 of U.S. Pat. No. 3,824,437 also show circuits for vector rotators, 2/3 converters and 3/2 converters. The converter SR can be an intermediate circuit inverter with impressed dc-current in the intermediate circuit and a suitable control unit ST, as described for instance in FIGS. 12 to 16 of U.S. Pat. No. 3,824,437 or in U.S. Pat. No. 4,028,600. Voltage impressing converters may, of course, also be used, for instance, an intermediate circuit inverter with an impressed intermediate circuit voltage and a control unit corresponding to U.S. Pat. No. 4,480,301 or any other modern pulse inverter procedure. It is merely required of inverter and control unit that their output frequency be controllable up to values which lie above the frequencies provided for the normal operation of the rotating field machines. While in the cited U.S. Pat. No. 3,824,437, the vector VF(S) of the flow axis, i.e. sin WF and cos WF, were still detected by direct measuring by means of HALL-probes, U.S. Pat. No. 3,775,649 uses a calculator model for this purpose. The formation of the vector VF(S) results in the problem on which the invention is based. In the present case this vector VF(S) is derived from a current model, i.e., an arithmetic circuit IMOD. A voltage model, i.e., a corresponding arithmetic circuit UMOD corrects a possible erroneous calculation of the vector VF(S) which is caused by a misadjustment of the rotor resistance parameter $r_R$. In the case of DE-OS 34 30 386, the vector VF(S) is taken off at the volage model, an error of the voltage model being corrected by the use of the current model. Even in this case, the current model requires a sufficiently accurate value for the rotor resistance parameter.

In the present embodiment, the current model contains a flux calculator FCI which operates in the field-oriented coordinate system and which determines the difference frequency FR between the frequency of the calculated flux and the frequency N of the rotor. FR therefore corresponds to a model slip frequency from which a frequency adder FA determines the frequency FF of the field relative to the stator. A vector generator VOS forms therefrom the two components of the vector VF(S) which describe the calculated model flux axis and which are therefore given by:

$$\cos(\int FF dt) \text{ and } \sin(\int FF dt)$$

The input variable of the current model IMOD is the vector of the stator current. In the present embodiment the stator oriented actual current vector VI(S) which is transformed by means of a vector rotator VD(−), which also receives the model flux axis VF(S) as an input, into the coordinate system oriented to the model flux axis, to form the corresponding field-oriented current vector VI(F). As long as the auxiliary current control works with sufficient accuracy, the corresponding reference vector VI*(F) can also be used instead of the actual-current vector VI(F).

The flux calculator FCI requires the parameter value $r_R$ for the rotor resistance which is furnished by a servo system. This system corrects a starting value set by a potentiometer $r_{RO}$ by the output signal $dr_R$ of the integrating correction control CR1.

The input of this integrating control CR1 is connected to an evaluating device AE and receives the difference DE of an "actual" value EF1 and a reference value EF1' for the EMF components parallel to the model flux axis VF(S). EF1 is calculated by the flux calculator FCI of the current model IMOD and based on its model flux, while the corresponding component reference value EF1' is calculated in the voltage model UMOD.

The voltage model UMOD contains an EMF calculator ECU which in the present case operates with stator orientation and to which the stator-oriented vectors VI(S) of the current and VU(S) of the voltage are fed. The stator-oriented Cartesian components of the voltage vector VU(S) are calculated by a voltage detector UDET by means of a 3/2 transformer from the phase voltages at the lead of the stator winding. Furthermore, a further correcting device (for instance, a correction integrator control CR2) is provided in the voltage model UMOD which furnishes a corrected value for the stator resistance $R_S$. To the output of the EMF calculator ECU is connected a further vector rotator VD(−) controlled by VF(S) which rotates the EMF vector calculated in the stator reference system into a coordinate system oriented to the model flux axis VF(S). Of this transformed calculated EMF vector, only the component EF1′ parallel to the axis VF(S) is required as the corresponding reference value for the evaluating device AE as shown.

Figure 2:
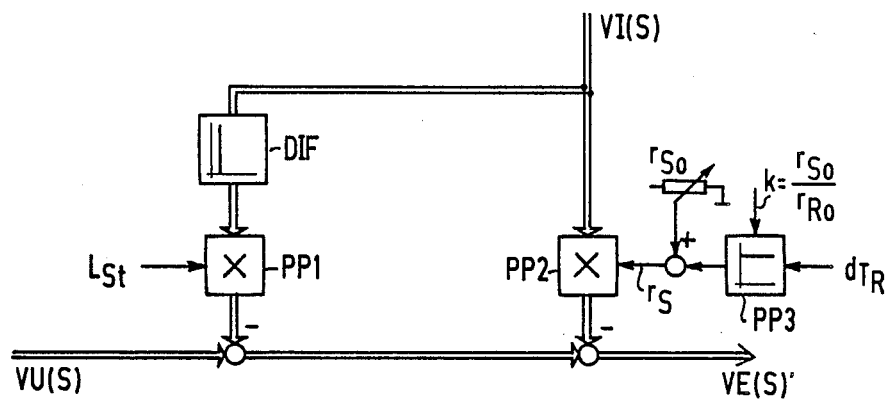
FIG. 2 shows a schematic diagram for a voltage model.

FIG. 2 shows a possible design of the EMF calculator ECU which calculates the stator-related EMF vector VE(S)′ in accordance with the vectorial relationship:

$$VF(s)' = VU(s) - r_s VI(s) - L_{sr} d(VI(s))/dt$$

ECU includes two proportional amplifiers PP1, PP2 and the differentiating stage DIF which differentiates the vector VI(S) as shown.

An offset in the correct stator resistance parameter $r_S$ causes an error in the component reference value EF1′ which enters with a gain kx into the determination of $r_R$. If one starts with parameters $r_{SO}$ and $r_{RO}$ for the stator resistance and the rotor resistance with the machine cold, a more accurate value for the stator resistance $r_S$ with warming-up due to operation is often reached if this value is increased for a temperature-dependent change $dr_R$ of the rotor resistance. As the proportionality factor, approximately the quotient k of the d-c resistances $r_{SO}$ and $r_{RO}$ can be used by scaler PP3. It should be noted, however, that this method basically works with impedances and that their resistance quotient is smaller than the corresponding quotient of the d-c resistances. A current displacement has a stronger effect in the rotor than in the stator at higher frequencies, so that the factor kx is smaller than k and the influence of the temperature increase therefore has less of an effect than in the d-c case. FIG. 2 shows the corresponding correction device which can be realized by a proportional amplifier PP3 with the gain k and the corresponding addition of the starting value for the stator resistance.

Figure 3:
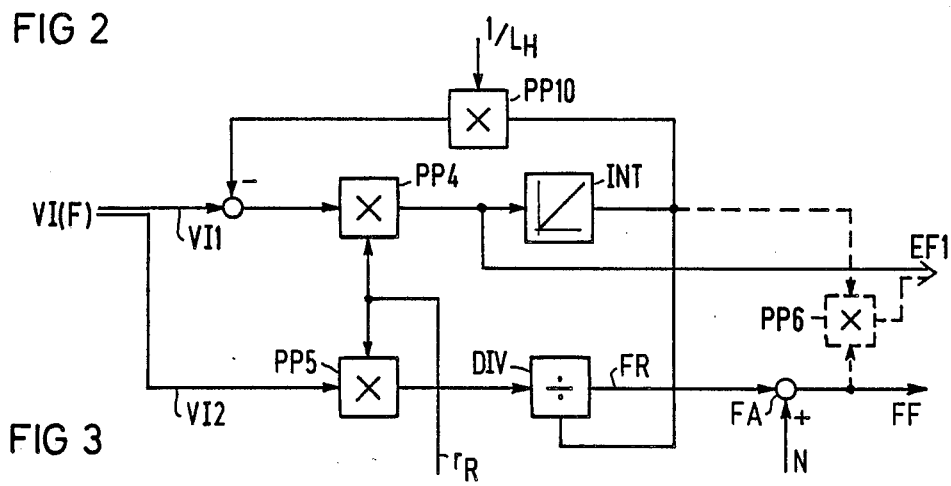
FIG. 3 shows a schematic diagram for a current model.

FIG. 3 shows an embodiment of a field-oriented current model which calculates the magnitude of the flux vector from the field-parallel component VI1, by means of a scaler or proportional stage PP4 and integrator INT. This magnitude of the flux vector is coupled in the negative feedback path by scaler PP10 (proportionality factor $1/L_H$), to the input of the proportionality stage PP4. $L_H$ is the main field inductance. The field-orthogonal component VI2 is fed via a proportional stage PP5 to a divider DIV, in which it is divided by the magnitude of the flux. To the stages PP4 and PP5 is fed the corrected rotor resistance parameter $r_R$ as the proportionality factor. The divider DIV furnishes at its output the slippage frequency FR, i.e., the difference frequency between the field axis and the rotor axis. By addition to the speed N (converted to electrical frequencies), the frequency FF of the field axis can therefore be formed in the stator reference system.

Since the output of the integrator INT represents the flux amplitude, i.e., the field-parallel component of the field vector itself, there is present at the integrator input its derivative in time, i.e., the field-parallel component EF1 of the EMF vector and can be taken off there. If required the field-orthogonal components EF2, can be formed by a multiplier PP6 from EF1 and the frequency FF.

For identifying the rotor resistance, a sinusoidal high-frequency component HF is superimposed on the stator current which is impressed on the machine by means of the reference current vector. Thus, for instance, a modulation frequency FM of 80 Hz, i.e., a value above the normal operating frequency, can readily be used as suitable high frequency However, this high frequency is impressed only on the component IF1 of a stator current vector VI(S) which is parallel to the model axis VF(S). This impression is advantageously accomplished by the provision that to the corresponding reference value IF1* of the parallel current component a sinusoidal supplemental reference value HF* is added by means of an oscillator OSC. (See FIG. 1).

Figure 4:
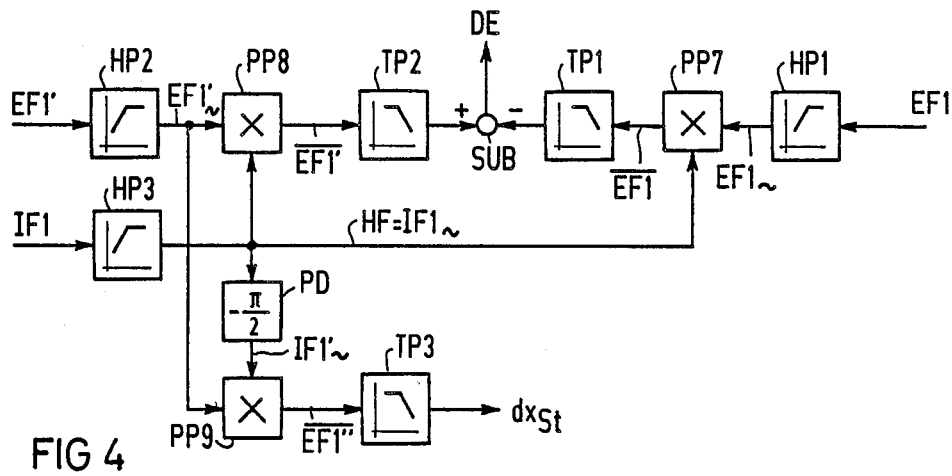
FIG. 4 shows an evaluating device in the arrangement according to FIG. 1.

FIG. 4 shows a preferred first embodiment of the evaluating device AE, the purpose of which is to determine the input signal DE for the correction control CR1 for readjusting the rotor resistance parameter. This correction control CR1 adjust the model parameter $r_R$ for the rotor resistance of the machine in the current model until its input signal, i.e. the deviation DE reaches zero. The reference value EF1′ for that deviation is calculated by means of the voltage model, while the model component EF1, calculated by means of the current model, contains a high frequency component which depends on the model parameter $r_R$ in a very specific manner. Deviation signal DE becomes zero if the field parallel components of EMF vector computed in both models coincide.

But for readjusting the parameter, only that portion of EF1′-EF1 is used which is correlated with the high frequency component. Preferably this evaluating device forms DE from that portions $\overline{EF1}$ and $\overline{EF1'}$ of the model component EF1 and model-component reference value EF1′ which are in phase with the high-frequency component. For this purpose high-frequency portions $EF1_\sim$, $EF1'_\sim$ in the two components EF1, EF1′ are first isolated in highpass filters HP1, HP2. Thus, d-c voltage components and portions which change with the frequency FF of the model flux axis are eliminated.

The in-phase portions $\overline{EF1}$ and $\overline{EF1'}$ are detected in a simple manner as follows. The high frequency portions $EF1_\sim$, $EF1'_\sim$ of the signals EF1 and EF1′ are isolated by high pass filters HP1, HP2 and their parts $\overline{EF1}$ and $\overline{EF1'}$ which are in phase with a high frequency signal $IF1_\sim$ are generated. That signal $IF1_\sim$ is parts of the component IF1 of the impressed current vector and generated by the output signal HF* of oscillator OSC and his high frequency FM (see FIG. 1). Therefore, the signal $IF1_\sim$ may be isolated by high pass filter HP3 fed by the actual component IF1 of the measured current vector VI(S) or VI(F). The in-phase portions $\overline{EF1}$ and $\overline{EF1'}$ correspond to the products $IF1_\sim \cdot EF1_\sim$ and $IF1_\sim \cdot EF1'_\sim$ which are calculated by multipliers PP7 and PP8 and smoothed in lowpass filters TP1 and TP2. The controll difference DE of the correction controller CR1 is determined by means of a subtraction stage SUB.

The evaluating device AE also makes possible the determination of the parameter $X_{St}$ corresponding to the stray inductance in the voltage model. The component $EF1_\sim$ generated in the machine and the current model IMOD has practically no phase shift relative to the impressed high-frequency component $IF1_\sim$ because of its high frequency. This applies also to the ohmic voltage component in the voltage model UMOD, so that in the high-frequency portion $EF1'_\sim$, an share portion which is out of phase by 90° relative to the high frequency component IF1 can be caused only by a misadjustment of the parameter $X_{St}$. This share portion is directly proportional here to the misadjustment $dx_{St}$ of $X_{St}$. If therefore the component IF1~ is rotated in a phase rotator PD by 90°, the product IF1'~·EF1'~ formed in a multiplier PP9 corresponds to said out-of-phase share portion of the model component reference value. The product is fed via a further lowpass filter TP3 as the parameter error $dx_{St}$ to the correction control CR2 in the voltage model, serving as the adjusting device.

The advantage of this method which operates with a harmonic, (i.e., sinusoidal) high-frequency modulation oscillation impressed on the flux-parallel stator current component, as compared to a method which uses low-frequency and/or pulse-shaped test signals for identification of the rotor resistance, is the following:

1. The flux remains nearly constant, so that the test signal practically has no effect on the torque; the control of the machine during starting is therefore also not influenced after the start.
2. The component EF1'~ to be evaluated is directly proportional to the rotor resistance.
3. An error of the stator resistance $r_S$, which is not known exactly, is decreased with increasing frequency of the test signal since the current displacement in the rotor is noticed more strongly than in the stator.
4. The influence of the stray inductance can be suppressed.

However, the consequence of the different current displacement in the rotor and in the stator has an effect since the variable $\overline{EF1'}$ which is computed in the stator-related voltage model, is correlated with the rotor resistance $r_R$ (T,F=FM) which occurs at the temperature T and a frequency F of the field-parallel current component IF1 which is equal to the frequency FM of the modulating high-frequency component. The voltage model thus identifies the reference value of the a-c impedance. For the physical operations simulated in the current model, however, the resistance $r_R$ (T,F=FR) plays a part which occurs at the temperature T and at a frequency F which is equal to the slippage frequency FR (i.e., the difference between the frequency of the model flux vector and the rotor speed N converted to electrical frequencies). The current model therefore takes practically into consideration the d-c resistance of the rotor. In order that the same quantities are compared with each other in the difference signal DE for the two quantities $\overline{EF1}$ and $\overline{EF1'}$, a function:

$$\frac{r_R (T,F = FM)}{r_R (T,F = FR)} = K(T,FM,FR)$$

must therefore be taken into consideration. For all practical purposes, FR can then be set zero.

Figure 5:
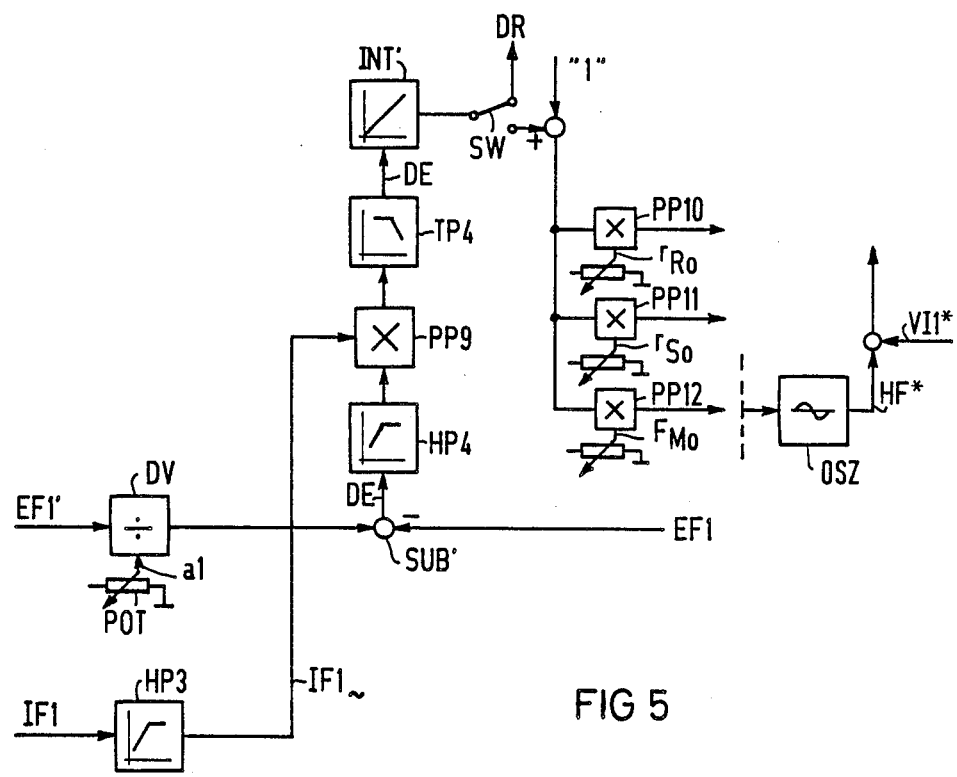
FIG. 5 shows another evaluating device with a frequency generator for generating a high-frequency component.

In the evaluating unit according to FIG. 5, this quotient is taken into consideration by a suitable current displacement functional which is fed to a divider DV for the a-c impedance associated with the quantity EF1'.

A comparison with FIG. 4 shows that in the evaluating circuit the insulation of the high-frequency components $\overline{EF1}$ and $\overline{EF1'}$ in phase with EF1~ and the formation of their difference are in principle interchangeable, so that ultimately, the difference De'=EF1'−EFA and, in the subsequent series circuit of a highpass filter HP4, a multiplier PP9 and a lowpass filter TP4 of the input signal DE for the correction control Cr1 is formed in the subtraction stage SUB', which control is realized here as an integrator INT' and furnishes the output signal DR.

First, the respective values $r_{RO}$ and $r_{SO}$ of the d-c resistances can be determined at the temperature $T_O$ of the cold machine from value tables which are given, for instance, frequently by the manufacturer in the course of production and are set, together with the starting value FMO of the modulation frequency, as multipliers for scaler PP10, PP11 and PP12. As long as the correction control INT' is not in used (by bringing its output signal Dr out of the circuit via a double-throw switch SW) or furnishes the value DR=0, as oscillator OSZ with a starting value FMO (for instance, 80 Hz) which forms the harmonic supplemental reference value HF* which together with the current component reference value VI1*, forms the component IF1 of the current vector orthogonal to VF(s). The parameters $r_{RO}=r_R(T=T_O, F=O)$ and $r_{SO}$ are entered into the current model and the voltage model. In the starting condition (T=$T_O$, machine with no load and at standstill), the share $\overline{EF1}$ correlated with NF* and IF1, respectively, of the EMF component EF1 computed in the current model, is determined by the d-c resistance $r_R(T=T_O, F=O)$. The similarly correlated component $\overline{EF1'}$ of the EMF component reference value EF1' is calculated in the voltage model and with the a-c impedance $r_R$ (T=$T_O$, F=FMO). The difference DE=($\overline{EF1'}$/a₁)−$\overline{EF1}$ therefore becomes zero if the current displacement factor a is adjusted at the potential POT and is fed to the divider DV for component EF1'. The factor a₁ is given by $$a_1 = \frac{r_R (T = T_o, F = FMO)}{r_R (T = T_o, F = O)}$$

If therefore a₁ is varied until the input signal DE of the integrator INT' becomes zero for the output signal DR=O, the current displacement factor at the temperature T=$T_O$ is identified.

As the running machine is warmed up, the d-c resistance $r_R$ (T, F=0), which can practically be set equal to the parameter $r_R$ (T, F=FR) required in the current model now increases, and the influence of the current displacement changes thereby changing the a-c impedance $r_R$ (T, F=FM) identified by the voltage model. However, the change of the current displacement can be balanced by compensating the change of the a-c impedance caused thereby through a corresponding increase of the modulation frequency FM. For the modulation frequency, a temperature dependent value FM(T) is therefore chosen in such a manner that $$\frac{r_R(T,F = FM(T))}{r_R(T,F = O)} = \text{const} = a_1 = \frac{r_R(T = TO,F = FMO)}{r_R(T = TO,F = O)}.$$

With this temperature-dependent setting of a variable frequency for the supplemental reference value, the current displacement function thus becomes the constant factor a₁ which can be determined before the machine warms up. The product (conductivity × frequency) is approximately temperature-independent:

$$\frac{FMo}{r_R(T = T_o, F = FMO)} = = \frac{FM(T)}{r_R(T,F = FM(T))}$$

For the choice of the temperature-dependent frequency $F_{M(T)}$ one obtains:

$$FM(T) = FMo \frac{r_R(T, F = O)}{r_R(T = T_o, F = O)} =$$

$$= FMo \left(1 + \frac{r_R(T, F = o) - r_R(T = T_o, F = o)}{r_R(T = T_o, F = F_o)}\right) =$$

$$FMo(1 + DR)$$

With this setting of the frequency F=FM(T) of the supplemental reference value HF* by the multiplier PP12, at the multiplier PP10 for the identified d.c.-resistance $r_R$ of the rotor the value $r_R(T, F=FM(T))=r_{RO}(1+DR)$ is generated and for the identified stator resistance $r_S$ at the multiplier PP11, the value:

$$\frac{r_{SO}}{r_{RO}} \cdot r_R = r_{SO} \cdot (1 + DR)$$

is formed when the modulation frequency F is slaved to the identified rotor resistance under the condition that the factor $a_1$ of the modulation frequency and the rotor resistance remains constant.

However, excessively high modulation frequencies are undesirable since, for instance, they can no longer be impressed exactly by the frequency converters of the machines in sue today and/or lead to timing problems if the evaluation is done digitally. In addition, excessive variations of the modulation frequency lead to the situation that a phase shift of 90° which is used in the evaluating device according to FIG. 4, for readjusting the stray inductance parameter $x_{St}$ is no longer possible by simple arrangements designed for a given frequency.

What is claimed is:

1. A method for determining the rotor resistance of a rotating-field machine, at standstill or at low load by means of a voltage model (UMOD) utilizing current values (VI(S)) and voltage values (VU(S)) and a current model (IMOD) for the machine fed with a signal derived form the rotor position (N) and a model parameter ($r_R$) for the rotor resistance of a machine, using model flux axis (VF(S)) determined by means of the two models, comprising the steps of:
   (a) impressing on the machine, a stator current corresponding to a reference current vector (VI*(S)), said current having a component parallel to the model flux axis (FV(S)), having a sinusoidal high-frequency portion (HF*) with a frequency above the nominal frequency of the machine;
   (b) calculating a model component (EF1) of the EMF vector of the machine parallel to the model flux axis (VF(S)) by means of the current model; and
   (c) calculating a model-component reference value (EF1') by means of said voltage model (UMOD) and generating a high frequency correlated deviation (DE) between said model component (EF1) and said model-component reference value (EF1'), and
   (d) correcting said model parameter ($r_R$) for the rotor resistance until said deviation is minimized.

2. Method according to claim 2, characterized by the feature that said high frequency correlated deviation is formed from portions ($\overline{EF1}, \overline{EF1'}$) of said model-component and said model-component reference value in phase with said high frequency portion (HF=IF1~).

3. Method according to claim 2, characterized by the feature that the in-phase portions ($\overline{EF1}, \overline{EF1'}$) of the model component and the model component reference value are formed by multiplication by the high-frequency component (HF=IF1).

4. Method according to claim 1, characterized by the feature that the frequency (FM) of the high-frequency component (HF*) is readjusted in such a manner that the ratio of the d-c resistance of the rotor and the resistance at the frequency of the high-frequency component is independent of the temperature.

5. Method according to claim 1, characterized by the feature that a parameter value for the stray inductance is readjusted in the voltage model until a component ($\overline{EF1''}$) of the model-component reference value phase shifted by 90° disappears.

6. Method according to claim 1, characterized by the features that the reference current vector is given in a coordinate system oriented to the model flux axis and the component of the reference current vector parallel to the model flux axis is modulated by means of a sinusoidal high-frequency supplemental reference value; that the control variable for a frequency converter is formed by means of a subordinate current control and at least one coordinate transformation dependent on the model flux axis; and the frequency converter feeds to the stator winding of the rotating field machine a stator current corresponding to the reference current vector and the supplemental reference value.

7. An apparatus for determining the rotor resistance of a rotating-field asynchronous machine at standstill or lowspeed, said machine having a stator winding comprising:
   a. a converter (SR) connected to said stator winding inputs;
   b. a control device (REG) receiving a first complex reference value having a parallel and an orthogonal component (IF1*, IF2*) corresponding to the flux in the machine, and a position value (VF(S)) corresponding to the position of the flux, said control device generating controls signals for said converter inputs, said control device including a harmonic oscillator (OSC) for generating a secondary reference signal added to the parallel component of said first complex reference value;
   c. a voltage detector (UDET) for detecting the voltage fed to the motor;
   d. means for generating a current signal (VI(S)) corresponding to a current fed to said machine by said covnerter;
   e. a voltage model computer (UMOD) connected to said voltage detector and said current signal generating means and receiving said position value for generating a reference signal (EF1') representing an EMF component parallel to the flux;
   f. a pickup device (NM) for sensing the position of said rotor;
   g. a current model computer (IMOD) including adjusting means for a rotor resistance parameter, connected to said current signal generating means and said pickup device, for generating an actual signal (EF1) representing a model EMF component parallel to the flux;
   h. an evaluating circuit (AE) receiving at least said reference signal and said actual signal, said evaluating circuit including filtering and subtracting means for isolating a high frequency portion of the difference of said reference signal and said actual signal and i. a correcting circuit receiving said difference signal and connected to said adjusting means for said rotor resistance parameter.

8. Apparatus according to claim 7, wherein said position value corresponding to the position of the flux is taken off at an output of the current model computer and is fed, additionally to an input of the control device (REG), to a vector rotator arranged at the output of the voltage model computer (UMOD).

9. Apparatus according to claim 7, wherein said current signal (VI(s)) is taken off at the output of a current detector (IDET) and is fed to a corresponding input of the current model computer (IMOD), the voltage model computer (UMOD) and inputs of current controllers (IR1, IR2) disposed in said control device.

10. Apparatus according to claim 9, wherein said filtering and subtracting means comprises, in series:
  a subtracting member (SUB, SUB');
  at least one highpass-filter (HP1, HP2, HP4) for said reference signal and said actual signal or for the difference of said signals; and
  at least one multiplier connected to the output of said current detector (IDET) via a further highpass-filter (HP3).

11. Apparatus according to claim 10, wherein said evaluating device contains a further multiplier connected to said series and said further highpass-filter, the output of said further multiplier connected to a parameter input of said voltage-model computer (UMOD).

12. Apparatus according to claim 10, further comprising multiplying means (PP10, PP11) connecting an output of said correcting circuit to said adjusting means and a parameter input of said voltage-model computer.

13. Apparatus according to claim 10 wherein a further output of the evaluating device (AE) generates a value formed by the reference (EF1') signal and the output of said further highpass-filter, said value being fed to a second correction control (CR2) at the input of the voltage model compouter (UMOD), the output signal of which gives the parameter of the stray inductance.

14. Apparatus according to claim 7, further comprising a frequency control, which readjusts the frequency of the oscillator (OSZ) as a funtion of the model-component reference value (EF1') in such a manner that the quotient of the rotor resistance at the readjusted frequency of the oscillator and the rotor resistance of the machine with d-c current is independent of the temperature.

* * * * *